United States Patent [19]

Lockwood et al.

[11] 4,052,252
[45] Oct. 4, 1977

[54] LIQUID PHASE EPITAXIAL GROWTH WITH INTERFACIAL TEMPERATURE DIFFERENCE

[75] Inventors: Harry Francis Lockwood, New York, N.Y.; Michael Ettenberg, Freehold, N.J.

[73] Assignee: RCA Corporation, New York, N.Y.

[21] Appl. No.: 565,092

[22] Filed: Apr. 4, 1975

[51] Int. Cl.² .................. B01J 17/04; H01L 21/208
[52] U.S. Cl. ........................... 156/622; 29/576 E; 148/171; 148/172; 156/624; 252/62.3 GA; 427/87
[58] Field of Search ................. 427/82, 86, 87; 156/622, 624, 621; 29/576, 580; 252/62.3 GA; 148/172, 173, 171

[56] References Cited

U.S. PATENT DOCUMENTS

| 3,783,825 | 1/1974 | Kobayasi et al. | 156/622 |
| 3,897,281 | 7/1975 | Gilbert et al. | 148/173 |
| 3,909,317 | 9/1975 | Itoh et al. | 427/87 |
| 3,925,117 | 12/1975 | Stone et al. | 148/172 X |

OTHER PUBLICATIONS

IBM Technical Disclosure Bulletin, vol. 13, No. 11, p. 3221, Apr. 1971.

Primary Examiner—Norman Yudkoff
Assistant Examiner—Barry I. Hollander
Attorney, Agent, or Firm—Glenn H. Bruestle; D. N. Calder

[57] ABSTRACT

A thin layer of semiconductor material with an extremely smooth surface can be grown on a substrate by liquid phase epitaxy. When the growing solution contacts the surface of the substrate, the substrate is at a lower temperature than the solution. The temperature difference should be less than 1° C and depends upon the desired degree of smoothness. Both the substrate and the solution are then cooled to permit deposition of the layer.

6 Claims, 1 Drawing Figure

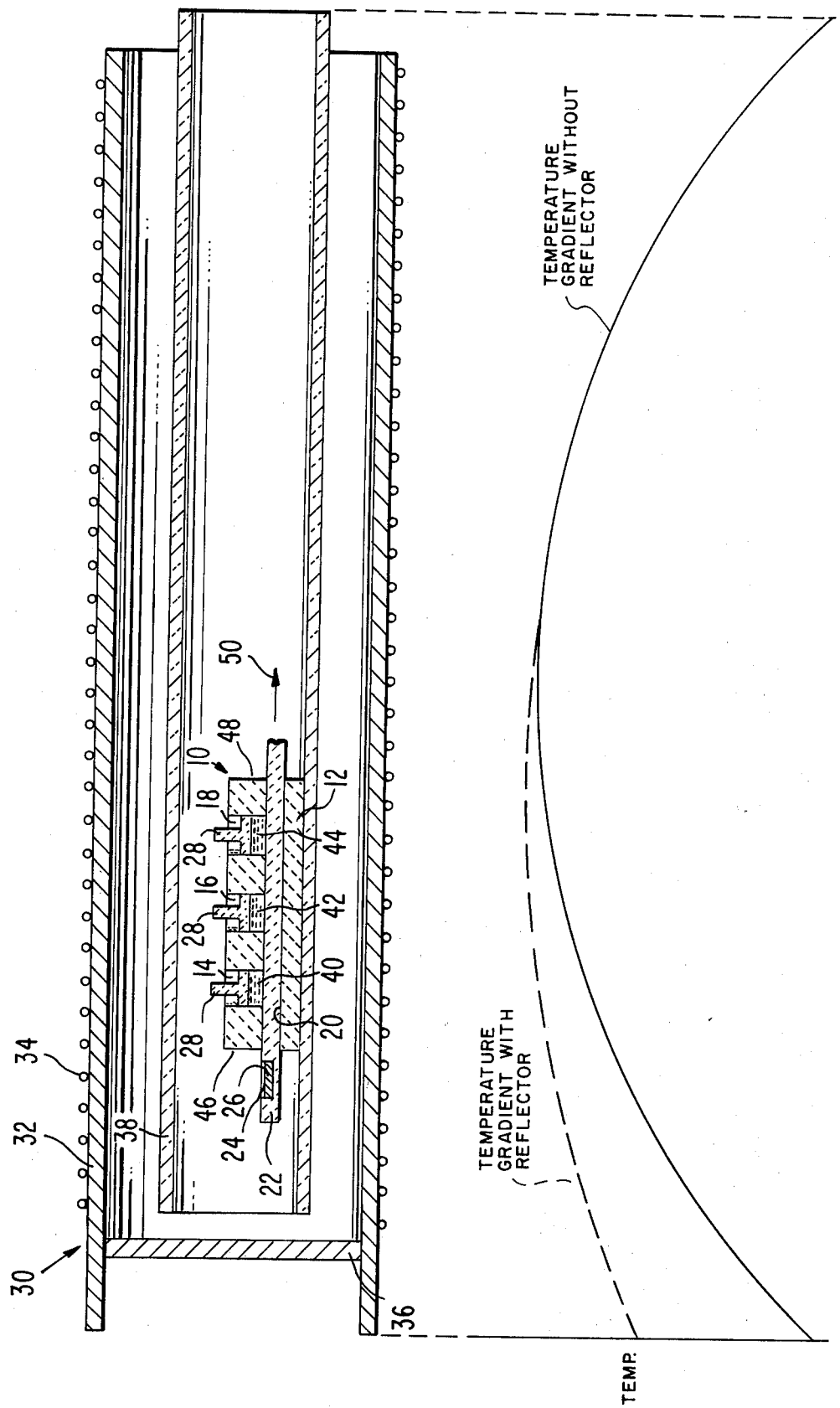

LIQUID PHASE EPITAXIAL GROWTH WITH INTERFACIAL TEMPERATURE DIFFERENCE

BACKGROUND OF THE INVENTION

This invention relates to liquid phase epitaxial growth of crystalline semiconductor material and more particularly to a method for growing extremely smooth layers of semiconductor material.

In multi-layered semiconductor devices, it may be desirable to grow extremely thin (less than 1 $\mu$m) layers. In these cases, the interfaces between the layers must be extremely smooth since even a small amount of roughness will often adversely effect the performance of the device. For example, the structure of a GaAs injection laser, designed for continuous operation at room temperature, has a recombination region which is typically 0.2 $\mu$m thick. An interface roughness of even 0.05 $\mu$m in this device would constitute a 25 percent variation in thickness and would decrease the device performance considerably. Therefore, it is necessary, when growing extremely thin layers of semiconductor material, that the surfaces and hence the interfaces be as smooth as possible.

Present liquid phase epitaxy techniques do not yield sufficiently smooth surfaces on thin layers. When both the substrate and the liquid phase solution are maintained at the same temperature during the crystal growth, the layer's surface has an intolerable degree of roughness. It is also well known, that layers may be grown in liquid phase epitaxy by keeping the solution a few degrees warmer than the substrate. Heretofore, with this latter technique, the temperature difference was at least 1° C. This difference in temperature is too great to produce a sufficiently smooth surface on layers which are less than 1 $\mu$m thick.

SUMMARY OF THE INVENTION

An extremely smooth layer of crystalline semiconductor material can be grown on a substrate by liquid phase epitaxy. A charge is heated to melt the ingredients forming a saturated solution. The substrate upon which the layer is to be deposited is heated to a lower temperature than the charge. The temperature difference should be less than 1° C. The substrate is then brought into contact with the charge solution and allowed to remain in contact with the solution for a predetermined interval. The temperature of the substrate and the solution is caused to decrease, while they are in contact, permitting the deposition of the layer.

BRIEF DESCRIPTION OF THE DRAWING

The FIGURE is an apparatus for carrying out the present method with the temperature gradiant of the apparatus with and without a reflector.

DESCRIPTION OF THE INVENTION

With reference to the Figure of the drawing, the present method may be carried out using a conventional liquid phase apparatus 10, which is similar to that shown in U.S. Pat. No. 3,753,801 issued on Aug. 21, 1973 to H. F. Lockwood et al. The apparatus 10 comprises a refractory furnace boat 12 of an inert material, such as graphite. Three wells 14, 16 ad 18 extend into the boat 12 from one surface. A passage 20 extends longitudinally through the boat 12 across the bottom of the wells 14, 16 and 18. A slide 22, of a material similar to that of the boat 12, extends through the passage 20. One surface of this slide 22 forms the bottom surface of the wells 14, 16 and 18. A recess 24 is in the one surface of the slide 22.

When practicing the present invention, a substrate 26 is placed in the recess 24, so that a small gap exists between the top of the substrate and the one surface of the slide 22. A charge is placed in the bottom of the wells 14, 16 and 18. Each of the charges is a mixture of a semiconductor material of the epitaxial layer to be deposited, a solvent for the semiconductor material, and, if the epitaxial layer is to be a particular conductivity type, a conductivity modifier. For example, to deposit epitaxial layers of gallium arsenide, the semiconductor material would be gallium arsenide, the solvent could be gallium, and the conductivity modifiers could be either tellurium or tin for an N type layer or zinc, germanium or magnesium for a P type layer. A weight 28, of an inert material such as graphite, is placed in each of the wells 14, 16 and 18 on top of the charges.

The apparatus 10 is placed in a quartz tube 38 through which high purity hydrogen flows. The quartz tube containing the apparatus 10 is positioned inside a furnace 30. The furnace 30 includes a tubular member 32 having two open ends. A heating coil 34 is wound around the tubular member 32. A heat reflector 36 is positioned at one end of the tubular member 32. When the furnace 30 is operating, the reflector 36 establishes and aids in controlling a longitudinal temperature gradient within the furnace. The reflector 36 reflects the heat which would otherwise escape from the one end of the open tubular member 32. In conventional furnaces without the reflector 36, the center of the furnace is at a higher temperature than the ends. A temperature gradient is therefore established between the center and the ends. By positioning the reflector 36 at various positions with respect to the one end of the tubular member 32, the contour of the temperature gradient may be altered to achieve the necessary temperature gradient for the present method. Due to the temperature gradient in the furnace 30, one end 46 of the apparatus 10, where the substrate 26 is initially positioned, is at a lower temperature than the other end 48 as hereinafter described.

The apparatus 10 is then heated in the furnace 30 so that each charge is entirely melted to form saturated solutions 40, 42 and 44 in the bottom of the wells 14, 16 and 18 respectively. The apparatus 10 is placed in the furnace 30 so that the temperature gradient in the furnace maintains each successive solution 40, 42 and 44 at a slightly higher temperature. The difference in temperature between each successive solution 40, 42 and 44 is less than 1° C. Initially the substrate 26 is heated to a lower temperature than the temperature of the first solution 40. This temperature difference also should be less than 1° C. The exact temperature difference required depends upon the thickness of the layer to be deposited. The temperature difference can be varied by positioning the apparatus 10 at different points along the temperature gradient in the furnace 30.

The slide 22 is pulled in the direction of the arrow 50. In order to grow each layer, the substrate is successively positioned directly beneath each of the three solutions 40, 42 and 44. The overall temperature of the furnace 30 is decreased (at rates of less than 1° C per minute) to cool the apparatus 10 and its contents. Since the substrate 26 is initially at a lower temperature than each solution 40, 42 and 44 when they come into contact with one another, the portion of each solution near the liquid-solid interface will be cooled causing some of the semiconductor material in the solution to precipitate and deposit onto the substrate 26. The deposition will continue due to the overall temperature decrease of the apparatus 10.

The substrate 26 remains beneath each well for an amount of time sufficient to deposit each layer. When one layer has reached the desired thickness, the slide 22 is moved so that the substrate is positioned beneath the next solution and so on until all of the layers are deposited. When the last layer has been deposited, the substrate 26 is removed from the final solution 44 and cooled. Due to the fact that the substrate 26 is initially at a slightly lower temperature than each solution at the time of deposition, the layer which is produced will have an extremely smooth surface. A temperature difference of from 0.1° C to 0.2° C between the substrate 26 and the solution 24 has been found to produce an extremely smooth surface on layers less than 1 μm thick.

The present invention has been described using an apparatus for depositing three epitaxial layers. It is readily apparent that this method may be used to deposit a greater or lesser number of layers. The present method may be carried out in other types of apparatus and furnaces than as shown in the drawing.

We claim:

1. A method for growing a layer of crystalline semiconductor material by liquid phase epitaxy comprising the steps of:
   heating a charge composed of a semiconductor material and a solvent to melt the charge and form a solution of the semiconductor material in the solvent;
   heating a substrate to a lower temperature than the solution where the temperature difference is less than 1° C;
   bringing the substrate into contact with the solution;
   cooling the solution and substrate at the same rate to deposit a layer of semiconductor material onto the substrate; and
   removing the substrate from contact with the solution after a predetermined interval.

2. A method as in claim 1 wherein the temperature differnce between the substrate and the solution is between 0.1° and 0.2° C.

3. The method as in claim 1 wherein the rate of cooling is less than 1° C per minute.

4. A method for growing multiple layers of crystalline semiconductor material by liquid phase epitaxy, said method comprising the steps of:
   heating a plurality of charges each composed of semiconductor material and a solvent, to melt the charge and form a solution of the semiconductor material in the solvent, each successive solution being maintained at a higher temperature, the temperature difference being less than 1° C;
   heating a substrate to a lower temperature than the lowest temperature of said solutions, the temperature difference being less than 1° C;
   bringing the substrate successively into contact with each solution for a predetermined interval, commencing with the coolest and progressing to the hottest solution; and
   cooling the solutions and the substrate at the same rate while they are in contact to deposit layers of the semiconductor material onto the substrate.

5. A method as in claim 4 wherein the temperature differences are between 0.1° and 0.2° C.

6. The method as in claim 4 wherein the rate of cooling is less than 1° C per minute.

* * * * *